(12) United States Patent
Larson et al.

(10) Patent No.: US 7,652,889 B2
(45) Date of Patent: Jan. 26, 2010

(54) INFORMATION TECHNOLOGY (IT) EQUIPMENT POSITION LOCATING SYSTEM USING JUMPER CONNECTIONS

(75) Inventors: Thane M. Larson, Roseville, CA (US); Christopher G. Malone, Loomis, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 484 days.

(21) Appl. No.: 11/258,665

(22) Filed: Oct. 25, 2005

(65) Prior Publication Data

US 2007/0091579 A1    Apr. 26, 2007

(51) Int. Cl.
*H05K 1/00* (2006.01)
(52) U.S. Cl. .................. 361/749; 361/796; 361/798; 361/800
(58) Field of Classification Search .............. 361/788, 361/796–798, 823–830
See application file for complete search history.

(56) References Cited

U.S. PATENT DOCUMENTS

| | | | | |
|---|---|---|---|---|
| 5,509,066 | A | * | 4/1996 | Saligny ..................... 379/327 |
| 5,696,820 | A | * | 12/1997 | Pelegris et al. ......... 379/413.04 |
| 6,550,673 | B2 | | 4/2003 | Massaro |
| 6,749,116 | B2 | | 6/2004 | Massaro |
| 7,140,782 | B2 | * | 11/2006 | Frohlich et al. ............... 385/53 |
| 7,324,632 | B2 | * | 1/2008 | Badura et al. ............ 379/88.07 |
| 2002/0199048 | A1 | | 12/2002 | Rabinovitz | |

* cited by examiner

*Primary Examiner*—Tuan T Dinh

(57) ABSTRACT

An apparatus adapted for locating position of an electronic system or device in an information technology (IT) center comprises a connector strip adapted for attachment to a rack cabinet configured for mounting multiple electronic devices, and a jumper adapted for interfacing an electronic device of the multiple electronic devices and configured to mate with and attach to the connector strip. The apparatus further comprises a logic adapted to identify position of the interfaced electronic device in the rack cabinet based on attachment of the jumper to the connector strip.

14 Claims, 6 Drawing Sheets

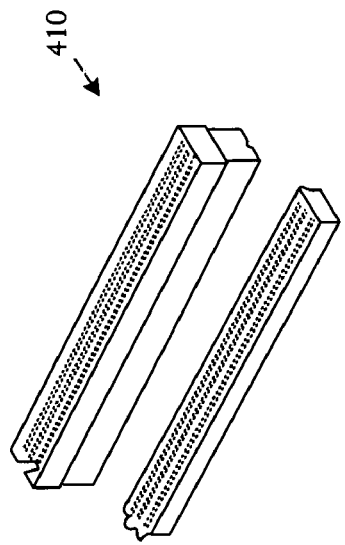
FIG. 4B
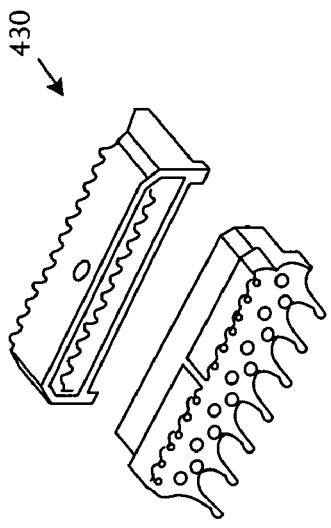
FIG. 4D
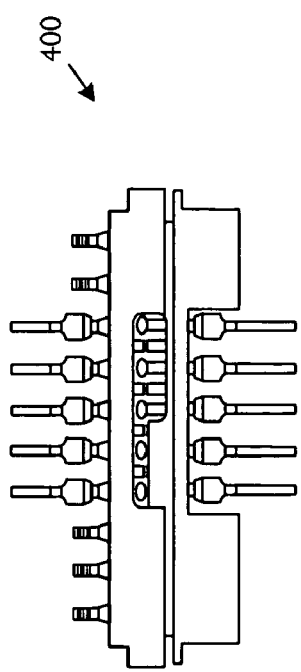
FIG. 4A
FIG. 4C

INFORMATION TECHNOLOGY (IT) EQUIPMENT POSITION LOCATING SYSTEM USING JUMPER CONNECTIONS

BACKGROUND OF THE INVENTION

Resource management involves awareness and monitoring of resources in a dynamic environment. Location is one component of awareness.

A data center may be considered a collection of many types of resources, often highly valuable resources. Data center resources are not limited simply to various types of electronic equipment, but also data and information resources which can potentially have a value exceeding that of the physical assets.

Data center personnel address a growing challenge in management of multiple systems and other information technology equipment in a large data center. Information technology (IT) equipment may be redeployed or physically moved without the knowledge of data center management personnel, presenting difficulty in locating the equipment for repair and upgrade. Difficulties are especially prevalent for data centers in remote offices and unmanned sites.

SUMMARY

In accordance with an embodiment of an apparatus adapted for locating position of an electronic system or device in an information technology (IT) center, a connector strip is adapted for attachment to a rack cabinet configured for mounting multiple electronic devices and a jumper is adapted for interfacing an electronic device of the multiple electronic devices and configured to mate with and attach to the connector strip. The apparatus further comprises a logic adapted to identify position of the interfaced electronic device in the rack cabinet based on attachment of the jumper to the connector strip.

BRIEF DESCRIPTION OF THE DRAWINGS

Embodiments of the invention relating to both structure and method of operation may best be understood by referring to the following description and accompanying drawings:

FIGS. 4A, 4B, 4C, and 4D are several pictorial diagrams illustrating embodiments of various types of connectors and jumper cables that may be used with the locating apparatus;

DETAILED DESCRIPTION

Figure 1:
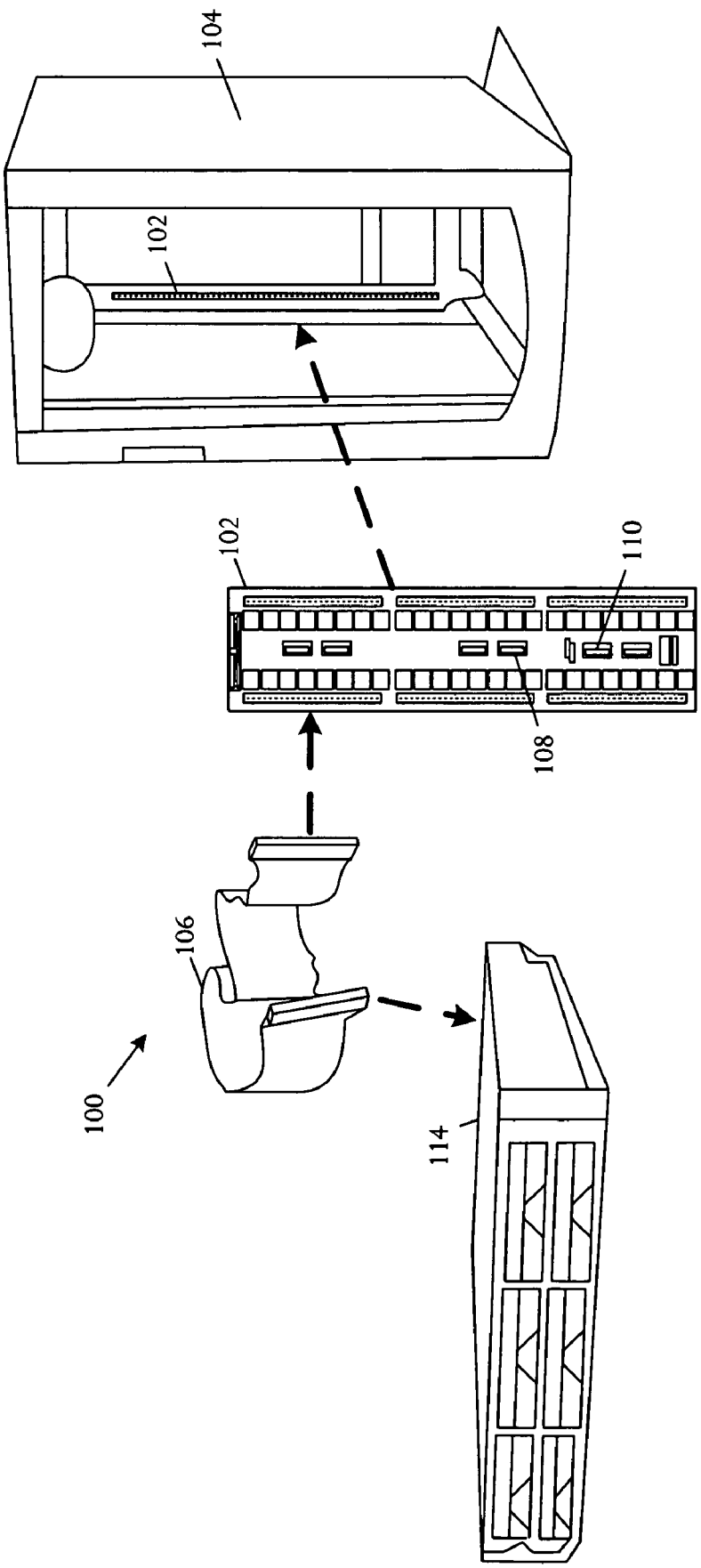
FIG. 1 is a schematic pictorial diagram illustrating an embodiment of an apparatus adapted for locating position of an electronic system or device in an information technology (IT) center.

Referring to FIG. 1, a schematic pictorial diagram illustrates an embodiment of an apparatus 100 adapted for locating position of an electronic system or device 114 in an information technology (IT) center. The apparatus 100 comprises a connector strip 102 adapted for attachment to a rack cabinet 104 configured for mounting multiple electronic devices, and a jumper 106 such as a jumper cable, blind-mate connection, or the like adapted for interfacing an electronic device 114 of the multiple electronic devices and configured to mate with and attach to the connector strip 102. The apparatus 100 further comprises a logic 108 adapted to identify position of the interfaced electronic device in the rack cabinet 104 based on attachment of the jumper 106 to the connector strip 102.

The illustrative apparatus 100 uses a rack-mounted strip of connectors 102 configured to mate to corresponding jumpers 106 on a server 114 or other electronic device. In an illustrative embodiment, individual connectors on the connector strip 102 may be spaced a single rack unit apart and the relative location, for example height, of the server 114 in the rack 104 can be identified according to the particular connector in the strip 102 that is attached to the server 114.

The illustrative apparatus 100 implements a simple structure including a rack cabinet 104 with a connector strip 102, for example a printed circuit board, that may be either powered (active) or non-powered (passive). The electronic device or system 114 may be connected by a blind-mate connection or jumper 106 in the form of a cable strip and connect to a location on the connector strip 102 that corresponds to the slot location in the rack cabinet 104 at which the electronic device 114 is mounted. Coding on the connection strip 102 enables the location or position of the electronic device 114 to be determined.

The connector strip 102 may be implemented relatively inexpensively as a single printed circuit board within a rack 104.

In the illustrative apparatus 100, electronic devices 114 are inserted in the rack cabinet 104 in multiple horizontal planes extending vertically from the bottom to top of the cabinet 104 and encoding of the connector strip 102 determines height of the electronic device 114 in the rack cabinet 104.

In other configurations, electronic devices 114 may be inserted into the cabinet 104. For example, devices 114 may mount in vertically extended slots in the cabinet 104 and lateral position may be encoded by the connector strip 102.

The logic 108 may implement a manageability application that uses the location information, such as height in the rack 104, in combination with location information determined using other techniques to determine the server location in multiple dimensions. For example, X and Y coordinate information indicative of position of a particular rack 104 on the floor of a data center may be combined with height information determined using the connector strip 102 and jumpers 106 to determine location of the server 114 or a particular corner of the server 114.

The logic 108 may be variously positioned according to application or other considerations. Typically, the logic 108 may be mounted in combination with the connector strip 102, such as on a printed circuit board holding the connectors of the connector strip 102. The logic 108 may also be mounted at any suitable location or position in the rack cabinet 104, or may be incorporated into any of the servers, electronic devices, electronic systems 114, and the like that may be mounted in the rack cabinet 104. The logic 108 may otherwise be located at any suitable location external to the rack cabinet 104, for example in a central management controller, system, or appliance.

In various implementations, the manageability application may be attached to either the rack 104 or the server 114.

Position information determined from connector strip encoding may be communicated through an external communication link such as a local area network (Ian) or other communication interconnect to a central management station, controller, or appliance to enable determination of position or location of the server 114 with reference to overall data center location. Similarly, the position information can be queried and read by the server 114 to enable the server 114 to determine its position of mounting.

The server 114 may store information that may be used in combination with the location information determined by the connector strip 102 and jumper 106 to supply additional manageability data. The server 114 may also acquire information useable for manageability operations from other sources, such as various connected sensors or components. For example in some arrangements, a server 114 that spans one or more slots in the rack cabinet 104 may read top and bottom locations on the connector strip 102 to self-determine server size. In one embodiment, the size may be determined using an equation such as top location minus bottom location plus 1). For a specific example, a top binary location of 000010 and a bottom location encoded 000001 indicates a size of 2U (2−1+1) for the server. In other examples, the server 114 may simply store the appropriate size information.

In some embodiments, the connector strip 102 may be non-powered and encodes height in the rack cabinet 104 as a binary code with a length sufficient to encode a maximum rack cabinet height. Manageability functionality may be implemented in hardware, firmware, or software which is attached to the server 114 in the illustrative scheme. The rack-mounted strip 102 may be completely passive and a connection to the jumpers 106 coded so that height in the rack 104 is determined through the jumper 106. For example in a 40U height rack, a total of six wires, which can designate up to $2^6$ or 64 units, may be allocated to encode height of the contact in a binary code. At a 1U height, a binary code of 000001 may be defined. Similarly, a code of 100000 designates a height of 32U.

One way of creating the code for a passive connector strip 102 defines binary "1" data as an open connection on a wire and defines binary "0" data as a line connected to electrical ground.

In other embodiments, the connector strip 102 may be powered and encodes height in the rack cabinet 104 in combination with other selected information. In the powered or "active" connector strip configuration fewer wires may be used. A serial protocol such as Inter-IC (I2C) bus protocol may be used. The I2C bus is a bi-directional two-wire serial bus that forms a communication link between integrated circuits (ICs). I2C is commonly used in embedded applications and mass-produced electronic items such as televisions, video cassette recorders (VCRs), digital versatile disks (DVDs), audio equipment, and the like. The two-wire I2C protocol interface enables the connector strip 102 to be programmed with information such as X, Y location information for the rack 104. In other configurations, the X, Y location information may be acquired using other techniques. In either case, the server 114 may be used to connect to an overall manageability network and transmitting aggregate information on the network.

Some systems may include a serial interface 110 arranged to communicatively couple an electronic device to the rack cabinet 104. The logic 108 may be coupled to the rack cabinet 104 and adapted to receive information from the electronic device and relay the information to a network. Manageability operations may be attached to the rack 104 in a scheme in which the rack connector strip 102 is active and has processing power. A serial connection 110 may be established to enable the server 114 to transmit useful information such as server size to the rack connector strip 102. The rack strip 102 in the active configuration enables connectivity to an overall manageability network and transmits aggregate information on the network.

In various embodiments, electronic systems, devices, and components that are held in the racks include various combinations of servers, computer systems, workstations, networking devices, storage devices, and the like.

Figure 2:
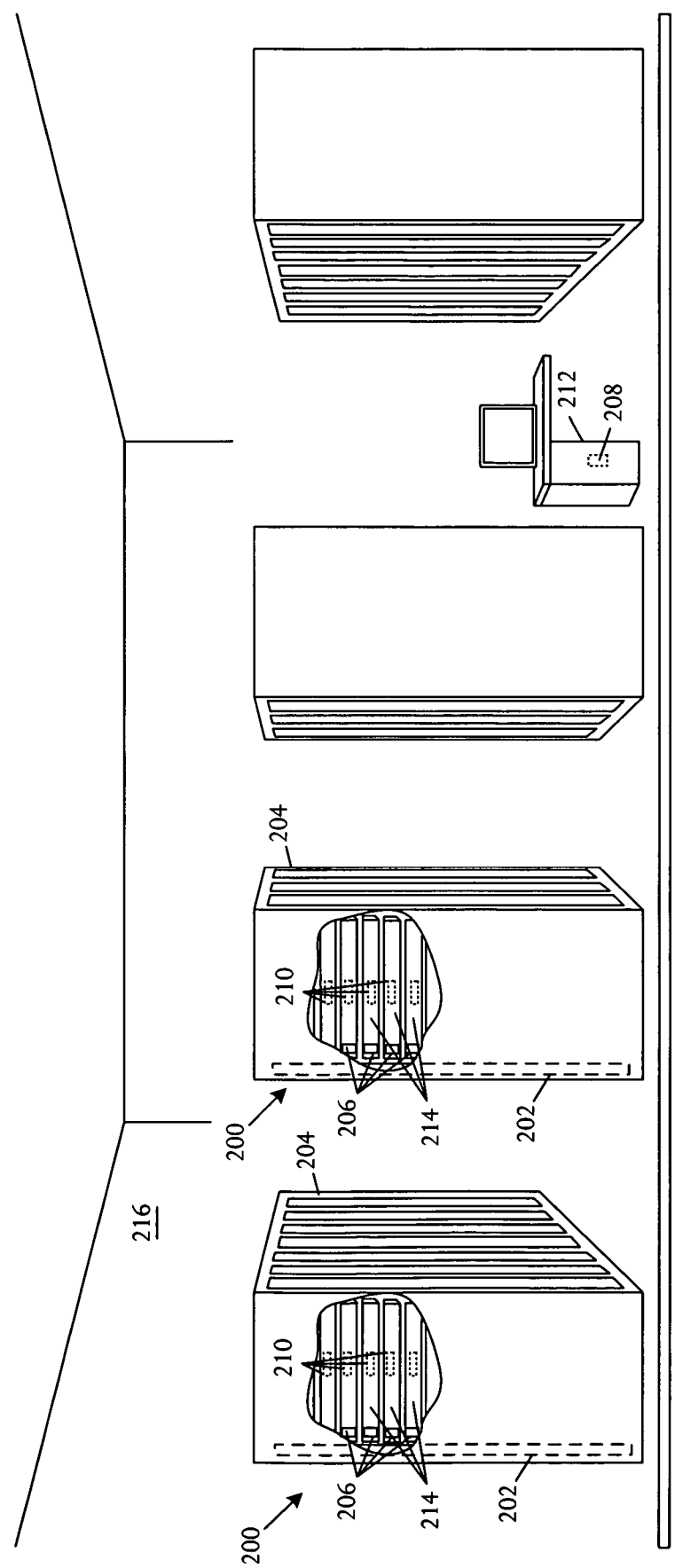
FIG. 2 is a perspective pictorial diagram showing another embodiment of a locating apparatus which is adapted for usage in an information technology (IT) center such as a data center.

Referring to FIG. 2, a perspective pictorial diagram illustrates another embodiment of a locating apparatus 200 adapted for usage in an information technology (IT) center such as a data center 216. The apparatus 200 comprises a rack cabinet 204 adapted for mounting a plurality of electronic devices 214 and a connector strip 202 coupled to the rack cabinet 204 and configured to mate with and attach to a jumper 206 which interfaces an electronic device configured to mount in the rack cabinet 204. A logic 208 is coupled to the rack cabinet 204 and adapted to identify position of the interfaced electronic device 214 in the rack cabinet 204 based on attachment of the jumper 206 to the connector strip 202.

The apparatus 200 may also comprise a serial interface 210 that communicatively couples an electronic device to the rack cabinet 204 and a network interface 212 adapted to communicatively couple the logic 208 to a network. The logic 208 is configured to receive information from the electronic device and relay the information to the network.

Height information attained through usage of the connector strip 202 and jumpers 206 may be used in combination with X, Y location information as well as size information read from the server 214 for usage by a network controller, network management appliance, or other management device to implement network manageability. The location and size information may be used by the overall network management application to map or construct a picture of the data center 216. Mapping of the data center enables an administrator to efficiently determine location of vacant slots in a cabinet when additional capacity is added. Manageability information can be communicated on a network world-wide to enable global centralization of information technology management.

The apparatus 200 enables automated identification of position or location in three dimensions for electronic devices and systems 214 in an information technology or data center 216. The automated system is more accurate and fool-proof than conventional manual methods of maintaining logs. Reduced human intervention results in fewer mistakes.

Figure 3:
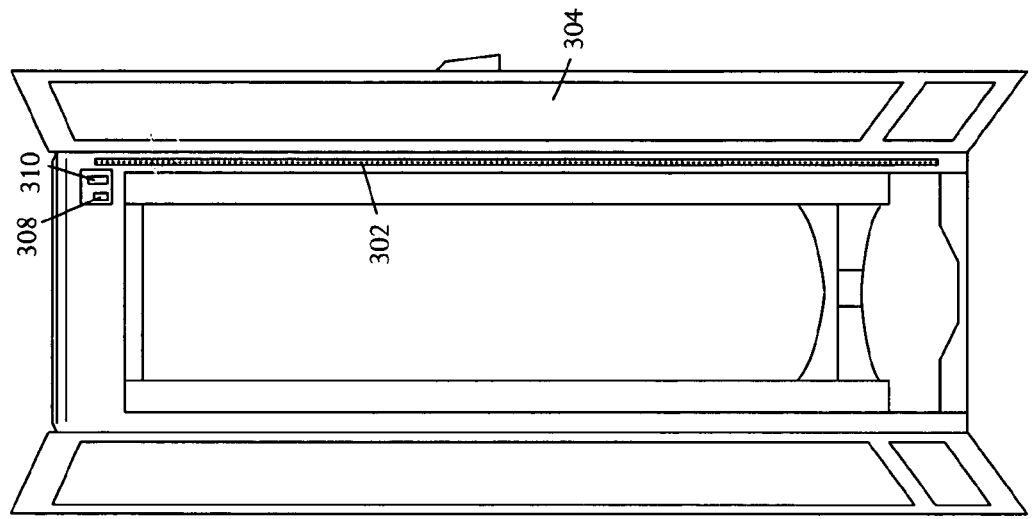
FIG. 3 is a perspective pictorial diagram depicting an embodiment of a locating apparatus including an electronic device and which is configured for usage in an information technology (IT) center.
Figure 3:
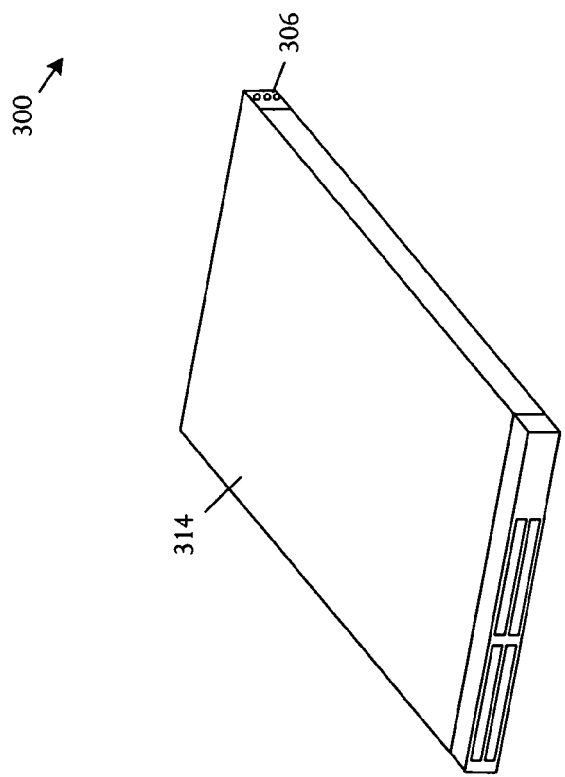

Referring to FIG. 3, a perspective pictorial diagram illustrates another embodiment of a locating apparatus 300 configured for usage in an information technology (IT) center. The apparatus 300 comprises an electronic device 314 and a jumper 306 coupled to the electronic device 314 and configured to mate with and attach to a connector strip 302 coupled to a rack cabinet 304 configured for mounting multiple electronic devices. A logic 308 is coupled to the electronic device and adapted to identify position of the electronic device 314 in the rack cabinet based on attachment of the jumper 306 to the connector strip 302.

In the illustrative embodiment, the logic 308 is formed on or adjacent to the connector strip 302 within the rack cabinet 304. In some examples, the logic 308 may be configured to execute Base Management Controller (BMC) functionality. For instance, an inexpensive, scaled-down version of BMC may be implemented in a processor or controller that is attached to a printed circuit card operating as the connector strip 302. The logic 308 may manage a table for monitoring servers, systems, and electronic devices that populate the rack cabinet 304. The table may further include information relating to various properties of field replaceable units which are mounted within the electronic devices and systems. Examples of such information include thermal properties and heat generation, power consumption, functionality, air flow consumption, and the like. Other information may relate to deployment or repair operations on a server that can assist in trouble-shooting and servicing in a data center that may include hundreds or thousands of electronic devices and field replaceable units. The information in combination with location information enabling precise determination of server position may be used to improve servicing and repair efficiency.

The illustrative rack cabinet 304 has a connector strip 302 located on an interior rear panel on the right side of the cabinet. In various embodiments, the connector strip 302 may be positioned in any suitable location, for example on the front, back, or sides of the cabinet and may be located at any suitable position from mid-panel to lateral extremities. A connector strip 302 positioned near the cabinet front facilitates access.

In some embodiments, the locating apparatus 300 further comprises a serial interface 310 communicatively coupling the electronic device 314 to the rack cabinet 304. The logic 308 is adapted to access information from the connector strip 302 and relay the information to a network.

The electronic devices or systems 314 may be located in an information technology center, for example by attaching a connector strip 302 to a rack cabinet 304 that is configured for mounting multiple electronic devices 314. The rack cabinet 304 may be configured to receive and mount an electronic device 314 which includes a jumper 306 adapted to mate with and attach to the connector strip 302. Position of the mounted electronic device 314 in the rack cabinet 304 is identified based on attachment of the jumper 306 to the connector strip 302.

In some arrangements the electronic components, devices, and systems 314 may be all of a single type. More typically, multiple different types and combinations of electronic components, devices, and systems 314 may be used, for example including servers, computer systems, workstations, networking devices, storage devices, communications devices, and others.

In some embodiments or arrangements, the location or position identifying technique may further include encoding height of an electronic device 314 within the rack cabinet 304 in a non-powered connector strip 302 as a binary code with a length sufficient to encode a maximum rack cabinet height. In one example of a suitable embodiment, the electronic device 314, for example a server, may read the connector strip 302 directly and perform a self-identification operation. The electronic device 314 can self-identify position using electrical signals in the form of bits set in the connector strip 302. For example, a 42U capacity rack 304 may encode position using six bits configured to produce a binary signal. The individual U positions can be encoded by attaching bits to an open connection or a ground connection, internally using a resistor connected to a voltage source, such as a five volt supply. The electronic device 314 reads the code and may supply the binary encoded data as self-identification to an application, such as a Base Management Controller (BMC) application, to facilitate management operations that perform various operations depending on position of the electronic device 314. Location information and data that depends on the location information may be consolidated and sent to a central management server, controller, or appliance to perform various management functions.

In other configurations, height of the electronic device 314 in the rack cabinet 304 may be encoded and selected information stored in a powered connector strip 302.

The serial interface 310 may be arranged to communicatively couple an electronic device 314 to the rack cabinet 304. The logic 308 coupled to the rack cabinet 304 may be adapted to receive information from the electronic device 314 and relay the information to a network.

Two-dimensional position information relating to location of the rack cabinet 304 may be combined with the identified position of the mounted electronic device 314 in the rack cabinet 304. A three-dimensional block diagram of a data center can be created based on the combined information. For example, a network management application can use the three-dimensional location information acquired from multiple electronic devices or systems 314 in a data center to create a full, three-dimensional block diagram of the data center. The mapping shows the three-dimensional location and the size of servers and systems within the data center including indication of vacant slots in the cabinets.

In some configurations, two-dimensional location information, which may be combined with location information designated by the connector strip 302 and jumper 306, may be programmed into the server 314 and accessed via communication interface. In some configurations, the rack position may be programmed into a controller or memory in the rack 304. In other configurations, other sources for the two-dimensional rack location information may be used. For example, Telcordia Common Language® (CLI) codes are defined for the telecommunications industry and may be used to assign a geographical location code to an item. Generally, Telcordia Common Language® codes are manually entered into a system and are subsequently used to determine various information such as billing for communication packets that travel through multiple regions, sites, and equipment supplied by various telecommunications service providers. In an illustrative technique, the connector strips 302 and jumpers 306 may be used to automate assignment of Telcordia Common Language® codes to a system. The illustrative apparatus 300 enables usage of Telcordia Common Language® codes at the rack level, for example facilitating usage of trouble-shooting information indicative of the precise rack 304 or electronic device or system 314 at which an event occurs.

Referring to FIGS. 4A, 4B, 4C, and 4D, several pictorial diagrams illustrate embodiments of various types of connectors and jumpers that may be used with the locating apparatus. Any suitable type of connector and jumper may be used, including connectors that are attached manually and connectors that automatically attach when an electronic device is mounted into a rack cabinet. FIG. 4A illustrates an example of a blind-mate connector 400 which are generally used as a pair or set including two connector subassemblies with a common mating interface. One subassembly typically contains one floating blind-mate interface with spring-loaded inner/outer contacts. The other subassembly generally is a fixed blind-mate interface with fixed inner/outer contacts. The illustrative connector 400 may have a thread less connector mating particularly configured for quickly mating.

FIGS. 4B-4D depict other connectors which are useful for automatic connection during mounting of an electronic device into the cabinet. Suitable connectors may include spring-fit connectors that interface with flat landing pads. A connector at the front of a rack cabinet may have a flange which makes contact with the printed circuit board of a connector strip using a contact pad. The printed circuit board includes a structure adapted to make electrical contact with the spring-fit connector coupled to the electronic device or server.

The jumper-connector strip connection may take any suitable form, for example including any structure such as pins or holes that align with conductive structures such as lead traces on the printed circuit board forming the connector strip.

The connector strip may be installed in a rack cabinet as part of the manufacturing or assembly process or may be retrofitted to an existing cabinet. A socketed connector 420, 430 such as those shown in FIGS. 4C and 4D may be connected to a printed circuit board forming a connector strip and enable hot-plug connections of mating connectors coupled to the server or other electronic device to physically engage interfaces of the electronic device and rack cabinet connector strip, thereby forming a jumper connection. The illustrative socket connectors facilitate interconnection while avoiding usage of structures that may otherwise break as the electronic device slides in and out of the cabinet.

Similarly, blind-mate press-fit or spring connections that may be implemented in connectors 400 and 410 such as those shown in FIGS. 4A and 4B form an elegant mechanical structure which are suitably aligned in the electronic device and cabinet to avoid breakage of pins and other structures during insertion of the device into the cabinet.

Figure 5B:
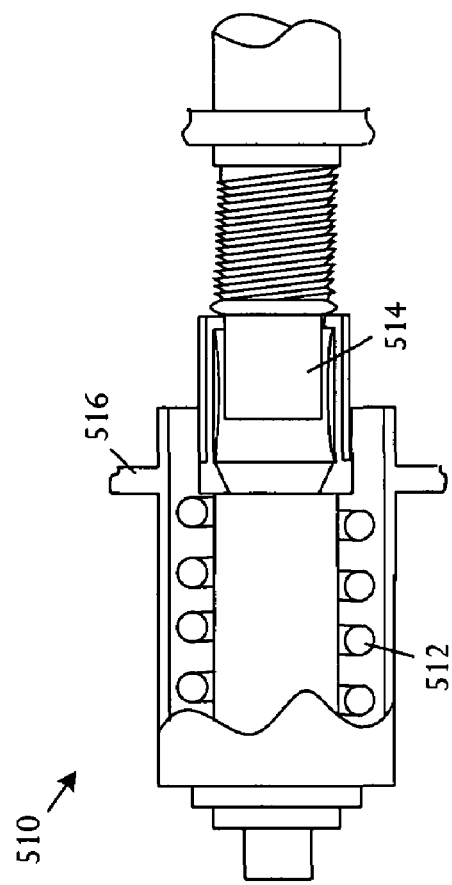
FIGS. 5A and 5B are pictorial views showing examples of a suitable blind-mate connector element 500 that may be used in embodiment of the position locating apparatus.
Figure 5A:
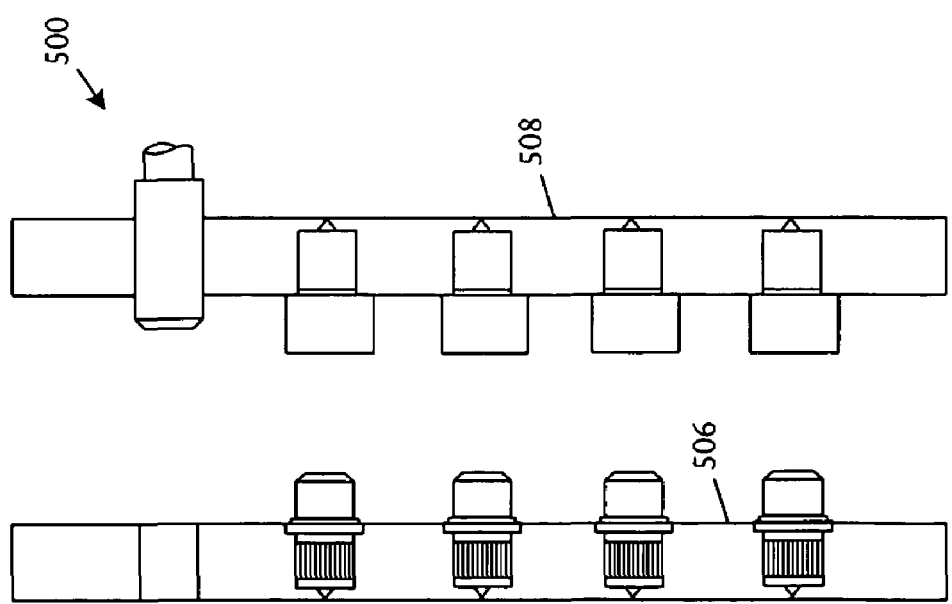

FIGS. 5A and 5B are pictorial views showing examples of a suitable blind-mate connector element 500 that may be used in embodiment of the position locating apparatus. Blind-mate connectors are typically used to mate components in rack-and-panel, module-to-module, or module-to-motherboard configurations.

FIG. 5A shows mating blind-mate connectors 500 including a fixed-mounted plug 506 and a fixed-mount jack 508. Other embodiments may be configured in a float-mount blind-mate configuration.

FIG. 5B illustrates a blind-mate connector interface 510 including a spring 512 which separates a blind-mate connector interface 514 from a flange housing 516. The spring 512 enables a floating action for misalignment tolerance, maintaining an effective mating connection.

Figure 6A:
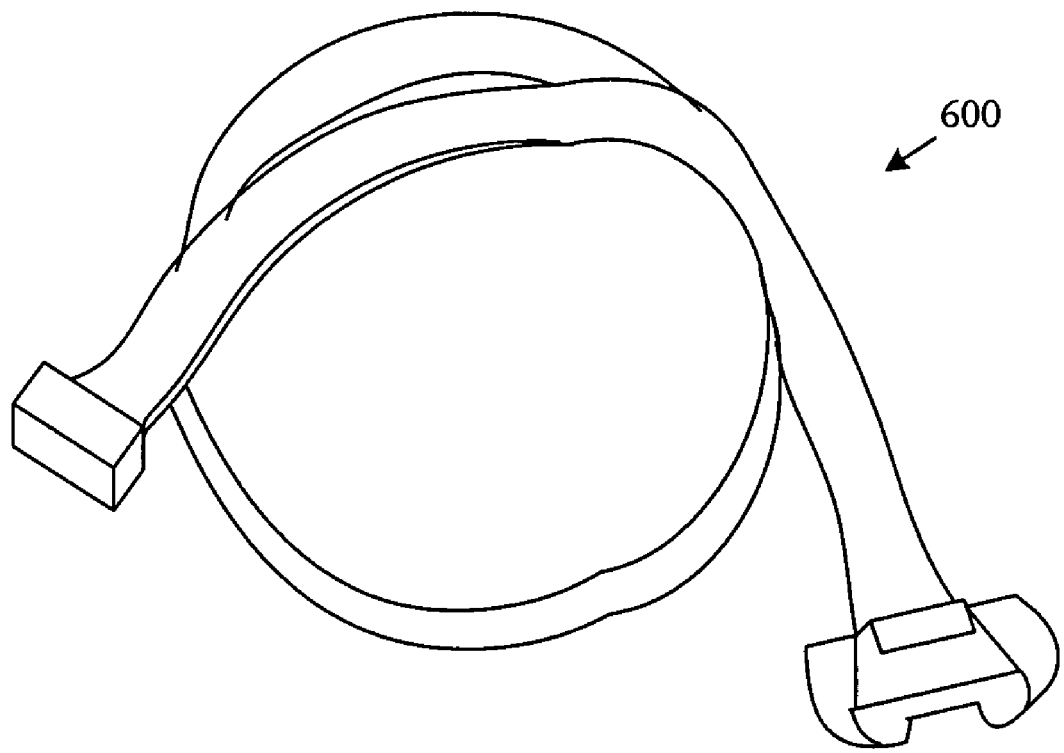
FIGS. 6A and 6B are pictorial diagrams showing various embodiments of jumper cables suitable for usage in the position locating apparatus.
Figure 6B:
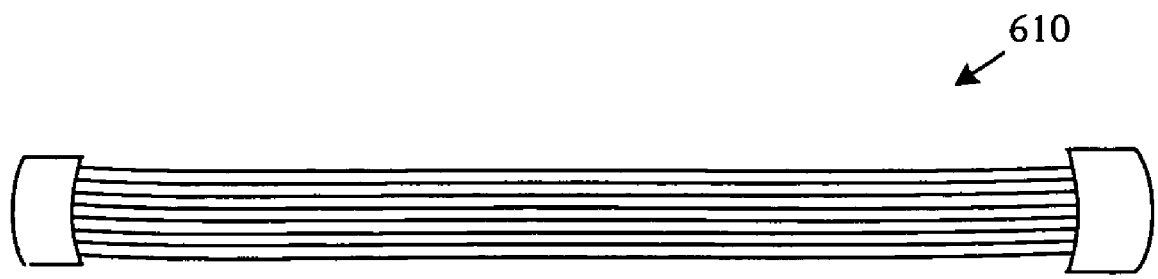

Referring to FIGS. 6A and 6B, pictorial diagrams show various embodiments of jumpers. In various embodiments, any suitable types of jumpers may be used. FIG. 6A shows a DB-n jumper 600 which includes n wires and is generally connected manually. Various cabling configurations of DB-n jumper cables 600 may be implemented, for example Y-cables attaching male to dual female connectors, and extension cables that are male to male. DB-n cables can be constructed in various lengths. FIG. 6B illustrates another example of a simple manual jumper cable 610 which may be used with the locating apparatus. The jumper cable 610 may be attached to a server or other electronic device and operate as a connection that extends to plug into the strip connector.

Cables 600 and 610 may be implemented to form a strip and box type connector in which a cable connects to the server or other electronic device and connect to a connector strip on a surface of the rack cabinet. The structure is simple and enables retrofitting of existing cabinets.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of jumpers, jumper cables, blind-mate connections, connectors, and connector interfaces or strips are described. The illustrative resource monitoring techniques can be used with any suitable types of cables and connectors. The illustrative examples depict various types of information which can be stored for access by associated logic in accordance with a particular location or server and various manageability operations performed according to position of a server or other electronic device. Any suitable type of information or manageability operation may be stored or executed based on location determined as described. The illustrative techniques may be used with any suitable data center configuration and with any suitable servers, computers, and devices.

What is claimed is:

1. An apparatus comprising:
  a connector strip adapted for attachment to a rack cabinet configured for mounting a plurality of electronic devices;
  a jumper adapted for interfacing an electronic device of the electronic device plurality and configured to mate with and attach to the connector strip; and
  a logic adapted to identify position of the interfaced electronic device in the rack cabinet based on attachment of the jumper to the connector strip; and
  a serial interface communicatively coupling an electronic device to the rack cabinet; and
  the logic coupled to the rack cabinet and adapted to receive information from the electronic device and relay the information to a network; and
  wherein the logic that acquires two-dimensional position information relating to position of the rack cabinet, combines the two-dimensional position information with the identified height position of the mounted electronic device in the rack cabinet, and creates a three-dimensional block diagram of the data center based on the combined information.

2. The apparatus according to claim 1 wherein:
  ones of the plurality of electronic devices are selected from among a group consisting of servers, computer systems, workstations, networking devices, and storage devices.

3. The apparatus according to claim 1 wherein:
  the connector strip is non-powered and encodes height in the rack cabinet as a binary code with a length sufficient to encode a maximum rack cabinet height.

4. The apparatus according to claim 1 wherein:
  the connector strip is powered and encodes height in the rack cabinet and selected information.

5. An apparatus comprising:
  a rack cabinet adapted for mounting a plurality of electronic devices;
  a connector strip coupled to the rack cabinet and configured to mate with and attach to a jumper which interfaces an electronic device configured to mount in the rack cabinet; and
  a logic coupled to the rack cabinet and adapted to identify position of the interfaced electronic device in the rack cabinet based on attachment of the jumper to the connector strip; and
  a serial interface communicatively coupling an electronic device to the rack cabinet; and the logic coupled to the rack cabinet and adapted to receive information from the electronic device and relay the information to a network; and wherein the logic that acquires two-dimensional position information relating to position of the rack cabinet, combines the two-dimensional position information with the identified height position of the mounted electronic device in the rack cabinet, and creates a three-dimensional block diagram of the data center based on the combined information.

6. The apparatus according to claim 5 wherein:

ones of the plurality of electronic devices are selected from among a group consisting of servers, computer systems, workstations, networking devices, and storage devices.

7. The apparatus according to claim 5 wherein:

the connector strip is non-powered and encodes height in the rack cabinet as a binary code with a length sufficient to encode a maximum rack cabinet height.

8. The apparatus according to claim 5 wherein:

the connector strip is powered and encodes height in the rack cabinet and selected information.

9. The apparatus according to claim 5 further comprising:

the logic assigning Telcordia Common Language codes based on the identified three-dimensional position of the mounted electronic device in the rack cabinet and data center.

10. An apparatus comprising:

an electronic device;

a jumper coupled to the electronic device and configured to mate with and attach to a connector strip coupled to a rack cabinet configured for mounting a plurality of electronic devices; and a logic coupled to the electronic device and adapted to identify position of the electronic device in the rack cabinet based on attachment of the jumper to the connector strip; and a serial interface communicatively coupling an electronic device to the rack cabinet; and the logic coupled to the rack cabinet and adapted to receive information from the electronic device and relay the information to a network; and wherein the logic that acquires two-dimensional position information relating to position of the rack cabinet, combines the two-dimensional position information with the identified height position of the mounted electronic device in the rack cabinet, and creates a three-dimensional block diagram of the data center based on the combined information.

11. The apparatus according to claim 10 wherein:

the electronic device is selected from among a group consisting of servers, computer systems, workstations, networking devices, and storage devices.

12. The apparatus according to claim 10 wherein:

the connector strip is non-powered and encodes height in the rack cabinet as a binary code with a length sufficient to encode a maximum rack cabinet height.

13. The apparatus according to claim 10 wherein:

the connector strip is powered and encodes height in the rack cabinet and selected information.

14. The apparatus according to claim 10 further comprising:

the logic assigning Telcordia Common Language® codes based on the identified three-dimensional position of the mounted electronic device in the rack cabinet and data center.

* * * * *

UNITED STATES PATENT AND TRADEMARK OFFICE
CERTIFICATE OF CORRECTION

PATENT NO. : 7,652,889 B2
APPLICATION NO. : 11/258665
DATED : January 26, 2010
INVENTOR(S) : Thane M. Larson et al.

Page 1 of 1

It is certified that error appears in the above-identified patent and that said Letters Patent is hereby corrected as shown below:

In column 9, line 25, in Claim 9, after "Language" insert -- ® --.

Signed and Sealed this

Fifteenth Day of June, 2010

David J. Kappos
*Director of the United States Patent and Trademark Office*